(12) United States Patent
Gruhlke et al.

(10) Patent No.: US 7,623,165 B2
(45) Date of Patent: Nov. 24, 2009

(54) VERTICAL TRI-COLOR SENSOR

(75) Inventors: Russell W. Gruhlke, San Jose, CA (US); Dariusz Burak, Fort Collins, CO (US); Thomas E. Dungan, Fort Collins, CO (US)

(73) Assignee: Aptina Imaging Corporation, Grand Cayman (KY)

( * ) Notice: Subject to any disclaimer, the term of this patent is extended or adjusted under 35 U.S.C. 154(b) by 513 days.

(21) Appl. No.: 11/362,711

(22) Filed: Feb. 28, 2006

(65) Prior Publication Data

US 2007/0200940 A1   Aug. 30, 2007

(51) Int. Cl.
*H04N 3/14* (2006.01)
*H04N 5/335* (2006.01)
*H04N 9/04* (2006.01)
*H01L 31/062* (2006.01)
*H01L 31/113* (2006.01)
*H01L 27/00* (2006.01)

(52) U.S. Cl. .................. 348/272; 257/290; 250/208.1
(58) Field of Classification Search ............. 348/272, 348/273; 257/293, 294
See application file for complete search history.

(56) References Cited

U.S. PATENT DOCUMENTS

| | | | |
|---|---|---|---|
| 3,971,065 A | 7/1976 | Bayer | |
| 5,841,143 A | 11/1998 | Tuma et al. | |
| 5,965,875 A | 10/1999 | Merrill | |
| 6,297,443 B1* | 10/2001 | Nakajima et al. | 136/258 |
| 7,538,405 B2* | 5/2009 | Gruhlke et al. | 257/436 |
| 2003/0103150 A1 | 6/2003 | Catrysse et al. | |
| 2004/0149928 A1* | 8/2004 | Gruhlke | 250/458.1 |
| 2006/0209413 A1 | 9/2006 | Kim et al. | |

OTHER PUBLICATIONS

Dmitruk et al., "Photosensitivity control of detectors based on surface plasmon-polariton resonance in Schottky structures", Proceedings of the 21st International Conference on Microelectronics (MIEL '97), Niš, Yugoslavia, Sep. 14-17, 1997, vol. 1, pp. 309-314, IEEE.

Dmitruk et al., "Sulfur passivation for photosensitivity control of detectors with corrugated metal—III-V semiconductors interface", Proceedings of the International Semiconductor Conference, 1997 (CAS '97), Sinaia, Romania, Oct. 7-11, 1997, vol. 1, pp. 263-266, IEEE.

Dmitruk et al., "Influence of multilayer coating peculiarities on efficiency of surface plasmon resonance photodetector", Proceedings of the International Semiconductor Conference, 1998 (CAS '98), Sinaia, Romania, Oct. 6-10, 1998, vol. 2, pp. 531-534, IEEE.

Dmitruk et al., "New advanced polaritonic photodetector on base of surface barrier structure", Proceedings of the 23rd International Conference on Microelectronics (MIEL 2002), Niš, Yugoslavia, May 12-15, 2002, pp. 313-316, IEEE.

(Continued)

*Primary Examiner*—Kelly L Jerabek
(74) *Attorney, Agent, or Firm*—RatnerPrestia

(57) ABSTRACT

A vertical tri-color sensor having vertically stacked blue, green, and red pixels detects at least blue and green components of incident light by converting the blue and green components to surface plasmons.

14 Claims, 10 Drawing Sheets

OTHER PUBLICATIONS

International Search Report—Appln. No. PCT/US2007/005225—Dated Aug. 8, 2007.

Foveon F018-50-F19 4.5 MP X3 Direct Image Sensor Product Brief, Foveon. Inc., Santa Clara, CA May 2004.

X3 Technology—Direct Image Sensors. Foveon, Inc. Santa Clara, CA 2005 [online], {retrieved on Feb. 28, 2006]. Retrieved from the Internet: <URL: http://www.foveon.com/article.php?a=67>.

X3 Technology—What's a Pixel. Foveon, Inc. Santa Clara, CA 2005 [online], {retrieved on Feb. 28, 2006]. Retrieved from the Internet: <URL: http://www.foveon.com/article/php?a=68>.

X3 Technology—Why Xe Is Better. Foveon, Inc. Santa Clara, CA 2005 [online], {retrieved on Feb. 28, 2006]. Retrieved from the Internet: <URL: http://www.foveon.com/article.php?a=69>.

Products—Foveon X3 10.2 MP. Foveon, Inc. Santa Clara, CA 2005 [online], {retrieved on Feb. 28, 2006]. Retrieved from the Internet: <URL: http://www.foveon.com/article.php?a=119>.

Products—Foveon X3 4.5 MP. Foveon, Inc. Santa Clara, CA 2005 [online], {retrieved on Feb. 28, 2006]. Retrieved from the Internet: <URL: http://www.foveon.com/article.php?a=120>.

* cited by examiner

VERTICAL TRI-COLOR SENSOR

BACKGROUND OF THE INVENTION

Sensor arrays are used in a wide variety of optical devices. A sensor array contains an array of pixels which are typically responsive to visible light and, to a lesser degree, to infrared light. Thus, a sensor array will produce a monochromatic signal representative of all colors of visible light, with each pixel producing a signal indicative of light incident on that pixel.

Any color, within limits, may represented by a linear combination of three additive primary colors, such as red, green, and blue. To enable a sensor array to sense color, a color filter array having red, green, and blue filter elements is overlaid on the sensor array so that each filter element of the color filter array is aligned with one pixel of the sensor array.

FIG. 1 shows a color sensor array including a color filter array 10 having red elements 12, green elements 14, and blue elements 16 arranged in what is known as a Bayer pattern, which is named after its inventor and is disclosed in U.S. Pat. No. 3,971,065. The Bayer pattern is a repeating pattern of a 2×2 array of color filter elements including one red element 12, two green elements 14, and one blue element 16. Thus, there are twice as many green elements 14 as there are red elements 12 or blue elements 16, which takes into account the fact that the human eye is more sensitive to green light than it is to red or blue light. The color filter array 10 is overlaid on a sensor array 18. Color sensor arrays embodying the basic structure shown in FIG. 1 and variations thereof are manufactured by many companies.

The red elements 12 block green light and blue light and allow only red light to reach the corresponding pixels of the sensor array 18, which therefore output only red color components. The green elements 14 block red light and blue light and allow only green light to reach the corresponding pixels of sensor array 18, which therefore output only green color components. The blue elements 16 block red light and green light and allow only blue light to reach the corresponding pixels of the sensor array 18, which therefore output only blue color components. Thus, two-thirds of the light incident on the color filter array 10 is blocked from reaching the sensor array 18, significantly reducing the overall detection sensitivity of the sensor array 18 for a color image.

If there are n×m pixels in the sensor array 18 (for example, 480×640 pixels), the resolution of the sensor array 18 for a monochromatic image is m×n (for example, 480×640 pixels). However, one 2×2 array of color filter elements including one red element 12, two green elements 14, and one blue element 16 in the color filter array 10 is required to detect one pixel of a color image. Thus, the resolution of the combination of the color filter array 10 and the sensor array 18 for a color image is m/2×n/2 (for example, 480/2×640/2=240×320), thereby significantly reducing the resolution of the sensor array 18 for a color image.

Furthermore, since each pixel in the sensor array 18 outputs only one of the color components red, green, and blue, it is necessary to interpolate the other two color components for that pixel using a demosaicing algorithm. Many such algorithms are known in the art. However, all of these algorithms introduce demosaicing artifacts into the interpolated color image, which degrade the quality of the image.

FIG. 2 shows a portion of a color sensor array 20 disclosed in U.S. Pat. No. 5,965,875 in which red, green, and blue pixels are stacked vertically in an attempt to solve the problems of reduced sensitivity and reduced resolution for a color image which are exhibited by the color sensor array shown in FIG. 1. Color sensor arrays embodying the basic structure shown in FIG. 2 are manufactured by Foveon, Inc., of Santa Clara, Calif., and include the Foveon F7X3-C9110 and FO18-50-F19 X3 direct image sensors.

The color sensor array 20 is based on the fact that light incident on the surface of a silicon substrate penetrates into the silicon substrate where it is absorbed over a characteristic absorption depth that depends on the wavelength of the light, and increases as the wavelength increases. Thus, blue light is absorbed over a first characteristic absorption depth, green light is absorbed over a second characteristic absorption depth deeper than the first characteristic absorption depth, and red light is absorbed over a third characteristic absorption depth deeper than the second characteristic absorption depth.

The color sensor array 20 includes a P-type silicon substrate 22. An N-type doped well region 24 is formed in the P-type silicon substrate 22 and forms a pn junction 26 with the P-type silicon substrate 22 at the characteristic absorption depth of red light. Thus, the pn junction 26 acts as a red-sensitive photodiode and detects red light incident on the color sensor array 20.

A P-type doped well region 28 is formed in the N-type doped well region 24 and forms a pn junction 30 with the N-type doped well region 24 at the characteristic absorption depth of green light. Thus, the pn junction 30 acts as a green-sensitive photodiode and detects green light incident on the color sensor array 20.

An N-type doped well region 32 is formed in the P-type doped well region 28 and forms a pn junction 34 with the P-type doped well region 28 at the characteristic absorption depth of blue light. Thus, the pn junction 34 acts as a blue-sensitive photodiode and detects blue light incident on the color sensor array 20.

A blue current detector conceptually shown in FIG. 2 as a blue current meter 36 is connected across the pn junction 34 acting as a blue-sensitive photodiode to detect a blue current $I_B$. A green current detector conceptually shown in FIG. 2 as a green current meter 38 is connected across the pn junction 30 acting as a green-sensitive photodiode to detect a green current $I_G$. A red current detector conceptually shown in FIG. 2 as a red current meter 40 is connected across the pn junction 26 acting as a red-sensitive photodiode to detect a red current $I_R$.

The color sensor array 20 may be considered to be composed of a blue pixel stacked on a green pixel stacked on a red pixel. However, this stacked structure makes the color sensor array 20 susceptible to crosstalk between the pixels.

For example, the green and red light pass through the blue pixel on the way to the green and red pixels. Although most of the green and red light will pass through the blue pixel without being absorbed because the blue pixel is at a shallower depth than the characteristic absorption depths of the green and red light, a certain portion of the green and red light will nevertheless be absorbed in the blue pixel. Thus, the blue current $I_B$ produced by the blue pixel is not an accurate representation of the blue light incident on the color sensor array 20 because a portion of the blue current $I_B$ was generated by the green and red light incident on the color sensor array 20.

Likewise, the red light passes through the green pixel on the way to the red pixel. Although most of the red light will pass through the green pixel without being absorbed because the green pixel is at a shallower depth than the characteristic absorption depth of the red light, a certain portion of the red light will nevertheless be absorbed in the green pixel. Thus, the green current $I_G$ produced by the green pixel is not an accurate representation of the green light incident on the color sensor array 20 because a portion of the green current $I_G$ was generated by the red light incident on the color sensor array 20, and a portion of the green light was absorbed in the blue pixel before it could reach the green pixel.

Finally, the red current $I_R$ produced by the red pixel is not an accurate representation of the red light incident on the color sensor array 20 because a portion of the red light was absorbed in the blue and green pixels before it could reach the red pixel.

Furthermore, the sizes of the blue, green, and red pixels are different, with the blue pixel being smaller than the green pixel and the green pixel being smaller than the red pixel. Thus, a portion of the blue light incident on the color sensor array 20 falls outside the blue pixel, and a portion of the green light incident on the color sensor array 20 falls outside the green pixel, which reduces the sensitivity of the color sensor array 20 to blue and green light and makes the blue current $I_B$ and the green current $I_G$ smaller than they should be, thereby introducing additional errors into the blue current $I_B$ and the green current $I_G$.

Also, although the overall size of the vertically stacked blue, green, and red pixels shown in FIG. 2 is smaller than the overall size of the 2×2 array of one red element 12, two green elements 14, and one blue element 16 in the color filter array 10 shown in FIG. 1, it is larger than one pixel of the sensor array 18 shown in FIG. 1. Thus, although the resolution of the vertically stacked blue, green, and red pixels shown in FIG. 2 is greater than the resolution of the color sensor array shown in FIG. 1 for a color image, it is smaller than the resolution of the sensor array 18 shown in FIG. 1 for a monochromatic image.

Accordingly, it would be desirable to have a color sensor array with vertically stacked blue, green, and red pixels of equal size no larger than one pixel of a monochromatic sensor array having reduced crosstalk between the pixels.

SUMMARY OF THE INVENTION

The invention relates to a vertical tri-color sensor having vertically stacked blue, green, and red pixels that detects at least blue and green components of incident light by converting the blue and green components to surface plasmons.

BRIEF DESCRIPTION OF THE DRAWINGS

Embodiments of the invention are described below in conjunction with the accompanying drawings of which.

DETAILED DESCRIPTION OF THE EMBODIMENTS

Figure 1:
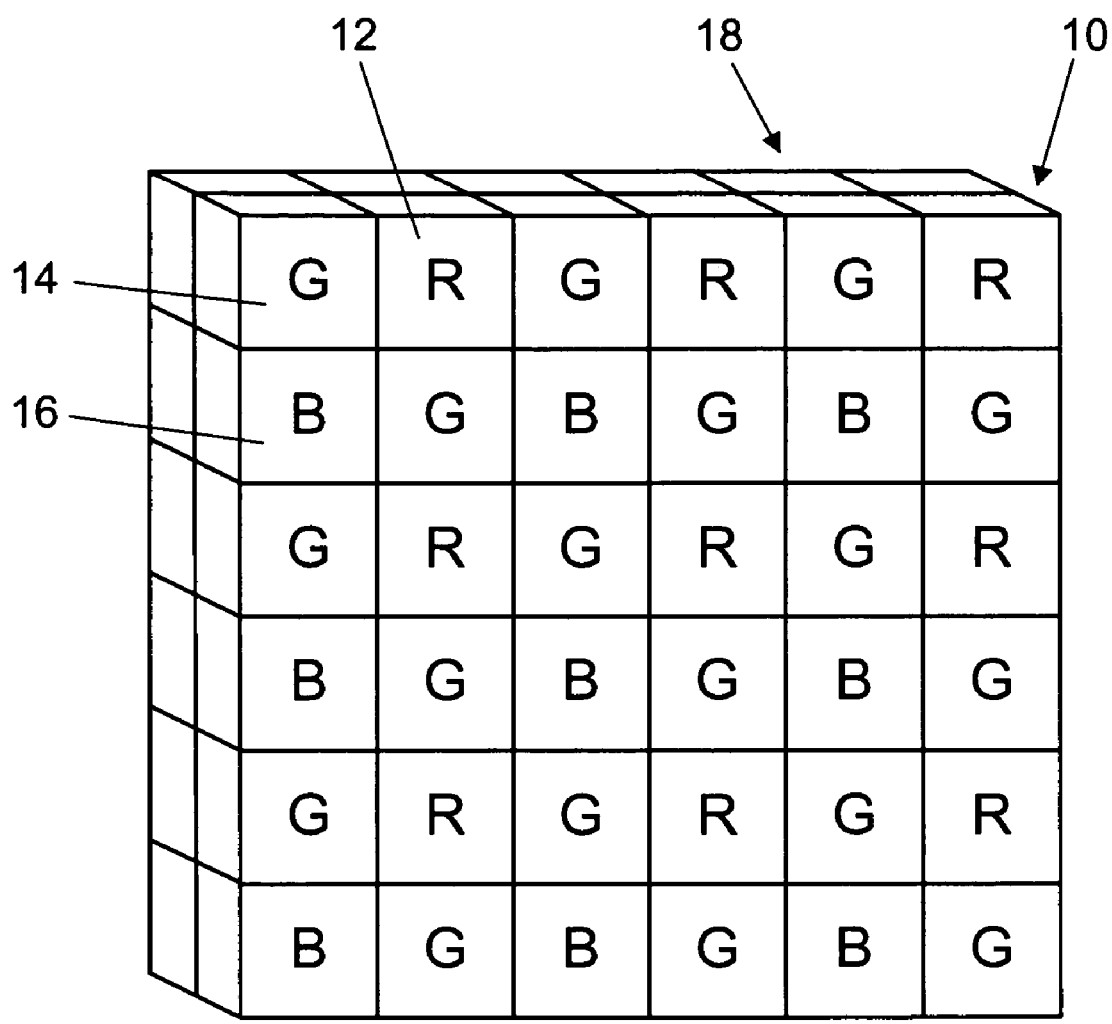
FIG. 1 shows a color sensor array of the related art.

Reference will now be made in detail to embodiments in accordance with the invention, examples of which are illustrated in the accompanying drawings, wherein like reference numerals refer to the like elements throughout. The embodiments in accordance with the invention are described below.

Figure 2:
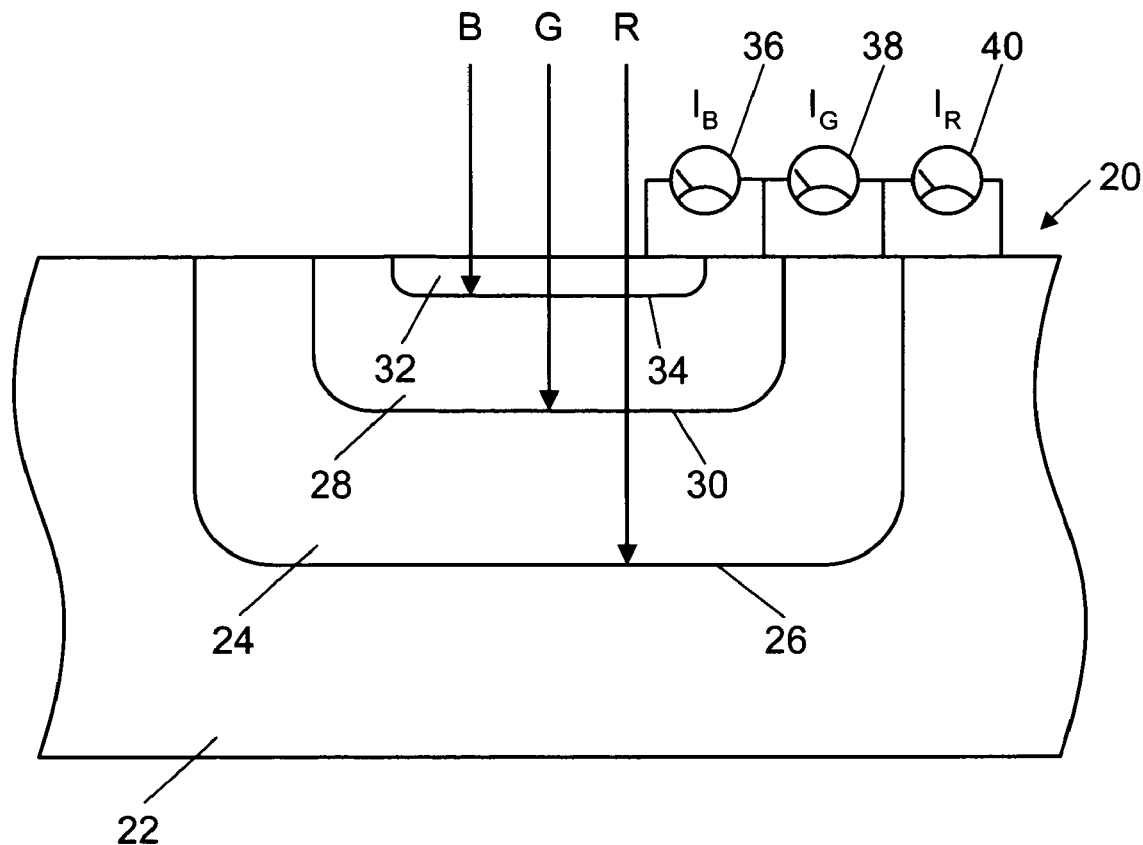
FIG. 2 shows a portion of another color sensor array of the related art.

It occurred to the inventors of this invention that blue, green, and red components of light incident on a silicon substrate can be detected by converting the blue, green, and red components to surface plasmons using three vertically stacked gratings or corrugated surfaces tuned to the frequency of the blue, green, and red components, and that such an arrangement would enable vertically stacked blue, green, and red pixels to be of equal size no larger than one pixel of a monochromatic sensor array, and that there would be reduced crosstalk between the pixels as compared to the color sensor array 20 of the related art shown in FIG. 2.

A surface plasmon can be thought of as a very highly attenuated guided wave that is constrained to follow a metal/dielectric interface, and is a combined oscillation of the electromagnetic field and the surface charges of the metal. A surface plasmon is not a light radiative state or a plane wave because its electric field profile decays exponentially away from the metal/dielectric interface. The electric field of a surface plasmon is called an evanescent wave.

Figure 3:
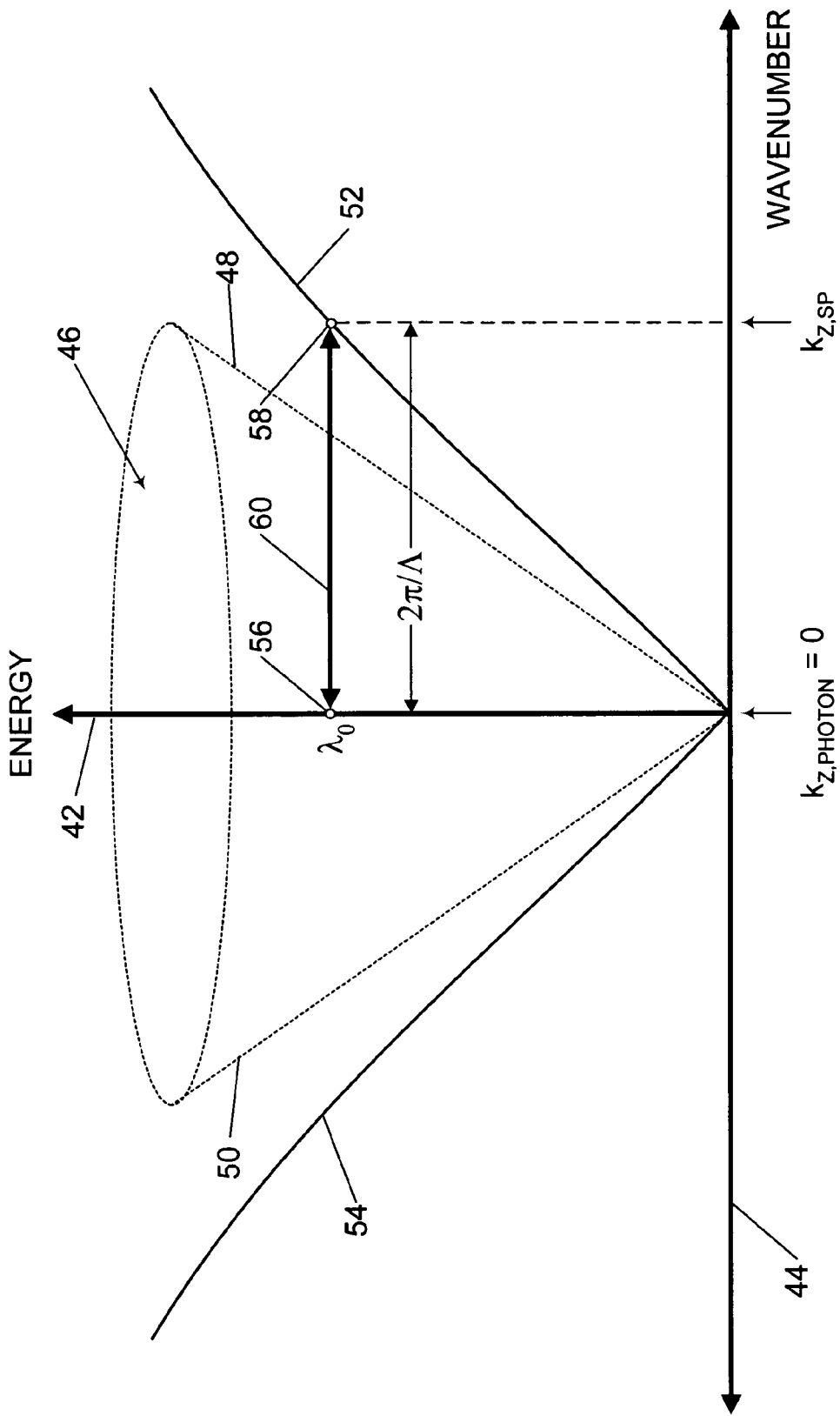
FIG. 3 is a graph of energy versus wavenumber showing a relationship between light radiative states or plane wave states lying within a light cone and surface plasmon states lying on single-interface surface plasmon dispersion curves, and showing a coupling between a photon and a surface plasmon.

FIG. 3 shows a graph of energy plotted on a vertical energy axis 42 versus wavenumber $k_Z$ plotted on a horizontal wavenumber axis 44. The wavenumber $k_Z$ is a component of a wavenumber k parallel to some interface along the Z axis.

The wavenumber k is defined by the following equation:

$$k = \frac{2\pi}{\lambda} \qquad \text{Equation 1}$$

where $\lambda$ is a wavelength.

The wavenumber $k_Z$ is defined by the following equation:

$$k_Z = \frac{2\pi}{\lambda} \cdot \sin\theta \qquad \text{Equation 2}$$

where $\lambda$ is a wavelength and $\theta$ is an angle of incidence measured from the normal to the interface.

The interface is a metal/dielectric interface along which surface plasmons propagate, and the metal/dielectric interface is substantially parallel to a light incident surface of a dielectric layer. Thus, a photon incident on the light incident surface of the dielectric layer travels through the dielectric layer before it reaches the metal/dielectric interface. The wavenumber $k_{Z,PHOTON}$ of such a photon is defined by the following equation:

$$k_{Z,PHOTON} = \frac{2\pi}{\lambda} \cdot n_d \cdot \sin\theta \qquad \text{Equation 3}$$

where $\lambda$ is the wavelength of the photon in a vacuum, $n_d$ is the index of refraction of the dielectric, and $\theta$ is the angle of incidence of the photon measured from the normal to the metal/dielectric interface.

The relationship between energy E and wavelength $\lambda$ is given by the following equation:

$$E = \frac{c \cdot h}{\lambda} \qquad \text{Equation 4}$$

where c is the speed of light and h is Planck's constant. As can be seen from Equation 4, energy E is inversely proportional to wavelength $\lambda$. Thus, as energy increases along the energy axis 42 in FIG. 3, wavelength decreases.

The relationship between momentum p and wavenumber k is given by the following equation:

$$p = \hbar k \qquad \text{Equation 5}$$

where $\hbar$ ("h bar") is the reduced Planck's constant (Planck's constant divided by $2\pi$). As can be seen from Equation 5, momentum p is directly proportional to wavenumber k. Thus, as wavenumber increases along the wavenumber axis 44 in FIG. 3, momentum also increases.

Each point in the graph in FIG. 3 represents a photonic state where the properties of that state are its energy (or wavelength) and its wavenumber (or momentum).

A light radiative state or a plane wave state, that is, light propagating in free space, must always must lie within a light cone 46 shown in FIG. 3. The light cone 46 represents all possible light radiative states or plane wave states. The right half of the light cone 46 on the right side of the energy axis 42 represents all possible light radiative states or plane wave states of photons that propagate in a forward direction, and the left half of the light cone 46 on the left side of the energy axis 42 represents light radiative states or plane wave states of photons that propagate in a backward direction. The energy axis 42 extending through the center of the light cone 46 represents light radiative states or plane wave states of photons that propagate normal to the metal/dielectric interface. A diagonal line 48 represents light radiative states or plane wave states of photons that propagate parallel to the metal/dielectric interface in the forward direction, and a diagonal line 50 represents light radiative states or plane wave states of photons that propagate parallel to the metal/dielectric interface in the backward direction.

All possible surface plasmon states of surface plasmons that propagate forward along a metal/dielectric interface are represented by a surface plasmon dispersion curve 52 to the right of the energy axis 42, and all possible surface plasmon states of surface plasmons that propagate backward along the metal/dielectric interface are represented by a surface plasmon dispersion curve 54 to the left of the energy axis 42. The surface plasmon dispersion curves 52 and 54 are called single-interface surface plasmon dispersion curves because the surface plasmons having states that lie on these dispersion curves are generated at a single interface between a metal layer and a dielectric layer.

In FIG. 3, $k_{Z,SP}$ is a wavenumber of a surface plasmon. The relationship between $k_{Z,SP}$ and a frequency f of the surface plasmon is a dispersion relation for the surface plasmons, and is given by the following equation:

$$k_{Z,SP} = \frac{2\pi f}{c} \sqrt{\frac{\varepsilon_m \varepsilon_d}{\varepsilon_m + \varepsilon_d}} \qquad \text{Equation 6}$$

where c is the speed of light, $\varepsilon_m$ is the permittivity of the metal, and $\varepsilon_d$ is the permittivity of the dielectric. However, for any material, $\varepsilon$ is a function of frequency, so Equation 6 is more complicated than it appears at first glance. Surface plasmon dispersion curves like surface plasmon dispersion curves 52 and 54 in FIG. 3 can be obtained by plotting frequency f as a function of $k_{Z,SP}$ in accordance with Equation 6. Surface plasmon dispersion curves 52 and 54 in FIG. 3 are merely representational in nature and are provided merely to illustrate the general appearance of surface plasmon dispersion curves. However, surface plasmon dispersion curves will always lie outside light cone 46.

The relationship between frequency f and wavelength $\lambda$ is given by the following equation:

$$f = \frac{c}{\lambda} \qquad \text{Equation 7}$$

where c is the speed of light. Substituting this relationship for f in Equation 6 results in the following relationship between the wavenumber $k_{Z,SP}$ of the surface plasmon and a wavelength $\lambda$ of the surface plasmon:

$$k_{Z,SP} = \frac{2\pi}{\lambda} \sqrt{\frac{\varepsilon_m \varepsilon_d}{\varepsilon_m + \varepsilon_d}} \qquad \text{Equation 8}$$

In order for a light radiative state to couple with a surface plasmon state, both energy and momentum must be conserved.

In order for energy to be conserved, a light radiative state 56, for example, of photons having a wavelength $\lambda_0$ propagating normal to the metal/dielectric interface must couple with a surface plasmon state 58 having the same wavelength $\lambda_0$.

However, the wavenumber $k_{Z,SP}$ (and thus the momentum p) of any surface plasmon state on the surface plasmon dispersion curve 52 on the right side of the energy axis 42 in FIG. 3 will always be greater than the wavenumber $k_{Z,PHOTON}$ (and thus the momentum p) of any light radiative state at the same energy E (or wavelength $\lambda$) because the surface plasmon dispersion curve 52 lies outside the light cone 46. The same situation applies on the left side of the energy axis 42. Thus, any surface plasmon state is a nonradiative state and under normal circumstances cannot be coupled with a light radiative state because momentum would not be conserved. Accordingly, under normal circumstances, the light radiative state 56 cannot couple with the surface plasmon state 58.

However, this inability of the light radiative state 56 to couple with the surface plasmon state 58 can be overcome by introducing a grating or corrugated surface at the metal/dielectric interface. In the presence of a grating or corrugated surface, the wavenumber of any photonic state will change by the following amount:

$$\pm \frac{2\pi}{\Lambda} \cdot m \qquad \text{Equation 9}$$

where $\Lambda$ is the periodicity of the grating or corrugated surface, and m is a diffraction order equal to an integer 1, 2, 3 . . . , which will be assumed to be equal to 1 in this discussion.

Thus, the wavenumber $k_{Z,PHOTON}$ of a photon having a wavelength $\lambda_0$ in the light radiative state 56 as shown in FIG. 3 will increase by $2\pi/\Lambda$ and become equal to the wavenumber $k_{Z,SP}$ of a surface plasmon having the same wavelength $\lambda_0$ in the surface plasmon state 58. Since the photon and the surface plasmon have the same wavelength, they also have the same energy, and since they now have the same wavenumber, they also now have the same momentum, and therefore the photon can couple with the surface plasmon since both energy and momentum are conserved. This coupling is represented by line 60 in FIG. 3. Thus, when a photon of wavelength $\lambda_0$ is incident on the metal/dielectric interface, it is converted into a surface plasmon of wavelength $\lambda_0$ which propagates along the meta/dielectric interface. The relationship between $k_{Z,SP}$ and $k_{Z,PHOTON}$ in this situation is given by the following equation:

$$k_{Z,SP} = k_{Z,PHOTON} + \frac{2\pi}{\Lambda} \qquad \text{Equation 10}$$

Substituting the expressions for $k_{Z,SP}$ and $k_{Z,PHOTON}$ from Equations 3 and 8 above into Equation 10 results in the following equation:

$$\frac{2\pi}{\lambda_0}\sqrt{\frac{\varepsilon_m \varepsilon_d}{\varepsilon_m + \varepsilon_d}} = \frac{2\pi}{\lambda_0} \cdot n_d \cdot \sin\theta + \frac{2\pi}{\Lambda} \qquad \text{Equation 11}$$

where $\lambda_0$ is the wavelength $\lambda_0$ shown in FIG. 3. Equation 11 can be solved to find a periodicity $\Lambda$ of a grating or corrugated surface required to couple a photon having a wavelength $\lambda_0$ and an angle of incidence $\theta$ measured from a normal to the metal/dielectric interface to a surface plasmon having the same wavelength $\lambda_0$ propagating along the metal/dielectric interface.

In the embodiments in accordance with the invention described below, the periodicity $\Lambda$ may be on the order of about 200 nm to 2000 nm, but may be larger or smaller if necessary.

In the embodiments in accordance with the invention described below, it is presumed that the angle of incidence $\theta=0°$, i.e., that light is incident normal to the metal/dielectric interface.

Figure 4:
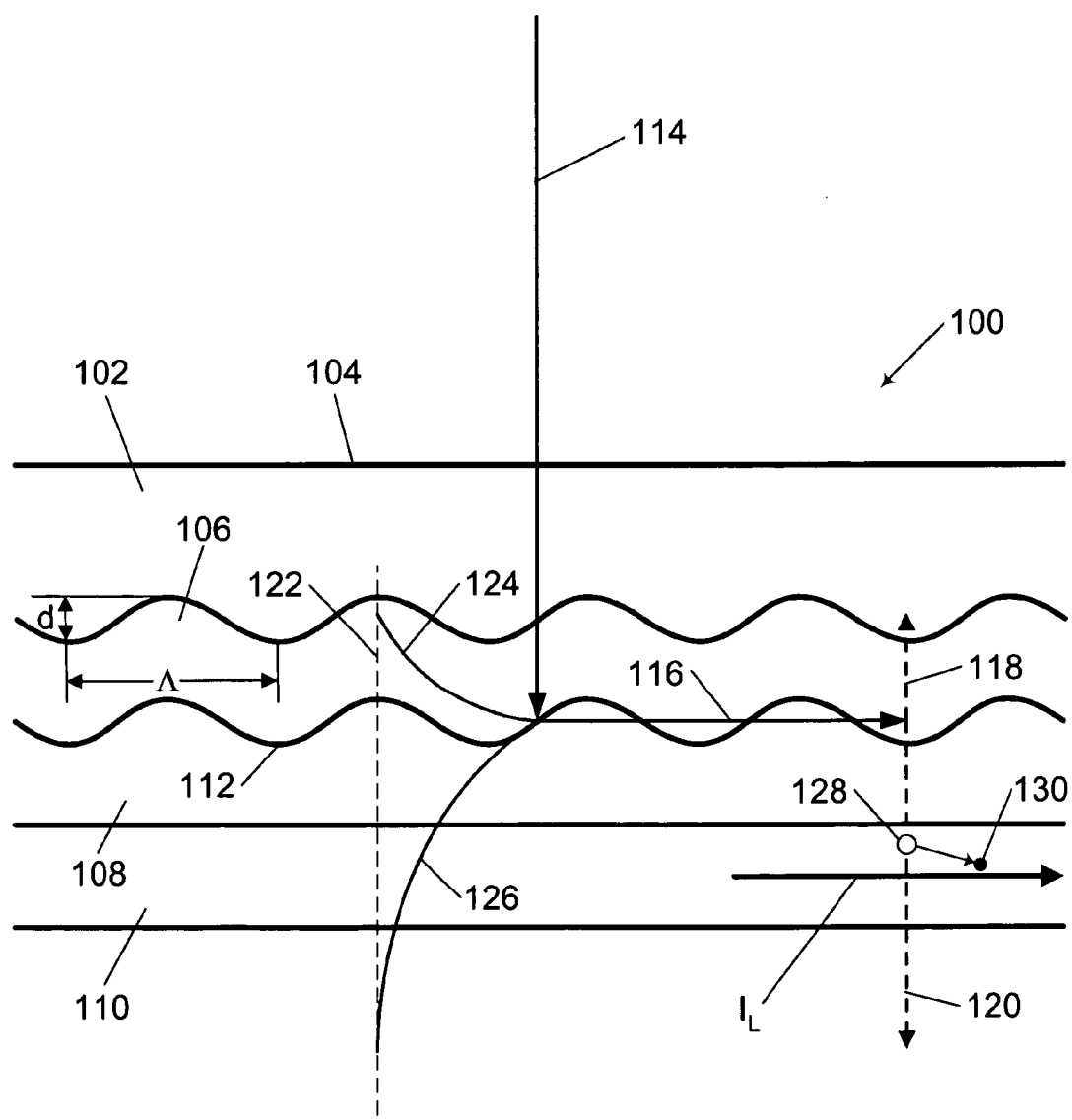
FIG. 4 shows a portion of a monochromatic sensor array in accordance with the invention.

FIG. 4 shows a portion of a monochromatic sensor array 100 in accordance with the invention. The other details of a monochromatic sensor array are known in the art, and are omitted in FIG. 4 for the sake of simplicity.

The monochromatic sensor array 100 includes a first dielectric layer 102 having an incident light surface 104 on one side and a corrugated surface on the opposite side having a periodicity $\Lambda$ and a depth d, a metal layer 106 having a corrugated surface on both sides matching the corrugated surface of the dielectric layer 102 (thus also having a periodicity $\Lambda$ and a depth d), a second dielectric layer 108 having a corrugated surface on one side matching the corrugated surface of the dielectric layer 102 (thus also having a periodicity $\Lambda$ and a depth d), and a semiconductor layer 110. One corrugated surface of the metal layer 106 contacts the corrugated surface of the first dielectric layer 102. The other corrugated surface of the metal layer 106 contacts the corrugated surface of the second dielectric layer 108 to form a corrugated metal/dielectric interface 112 having a periodicity $\Lambda$ and a depth d between the metal layer 106 and the second dielectric layer 108.

The metal layer 106 may be made out of any metal that is suitable for use in a sensor array, such as Ag, Au, Al, Ni, or any other suitable metal. Ag has the lowest losses for surface plasmons, but is more reactive than Au, so Au might be preferable to use even though it has higher losses for surface plasmons than Ag. The metal layer preferably has a thickness on the order of about 20 nm, but any thickness may be used as long as the resulting structure is capable of generating surface plasmons and the metal layer is thin enough to transmit a substantial portion of light incident on the metal layer. A suitable thickness may be determined by experimentation, but as an example, an Ag metal layer having a thickness of 50 nm is too thick because it will transmit only a few percent of light incident on it. The first dielectric layer 102 and the second dielectric layer 108 may be made out of $SiO_2$ or any other suitable dielectric. The semiconductor layer 110 may be a pn junction layer, a pin junction layer, or any other suitable semiconductor layer in which electron-hole pairs can be created.

A photon 114 incident on the incident light surface 104 penetrates the first dielectric layer 102 and the metal layer 106 and is converted to a surface plasmon 116 when it reaches the corrugated metal/dielectric interface 112. The surface plasmon 116 is called a single-interface surface plasmon because it is generated at a single interface between the metal layer 106 and the second dielectric layer 108, i.e., at the metal/dielectric interface 112. The surface plasmon 116 propagates along the corrugated metal/dielectric interface 112 substantially parallel to the light incident surface 104. The photon 114 may have any wavelength in the visible, infrared, and ultraviolet light ranges. However, when the present invention is applied to a color sensor array, the photon 114 will have a wavelength in one of the blue, green, and red light ranges.

The periodicity $\Lambda$ of the corrugated metal/dielectric interface 112 is calculated for the wavelength of the photon 114 and an angle of incidence $\theta=0°$ using Equation 11 described above.

The depth d of the corrugated metal/dielectric interface 112 will affect the efficiency of the coupling between the photon 114 and the surface plasmon 116. If the depth d is too shallow, almost no coupling will occur, since no coupling at all occurs for a flat profile. Also, if the depth d is too deep, for example, on the order of the wavelength of the photon 114, the efficiency of the coupling will be low. The optimum depth d may be determined by experimentation since it will depend on the particular configuration being used.

The surface plasmon 116 generates an evanescent wave having a component 118 which extends away from the corrugated metal/dielectric interface 112 into the metal layer 106 and a component 120 which extends away from the corrugated metal/dielectric interface 112, through the second dielectric layer 108, and into the semiconductor layer 110. The evanescent wave has an electric field profile which is shown with respect to a reference axis 122 which represents an electric field of zero. The component 118 of the evanescent wave which extends into the metal layer 106 and the component 120 of the evanescent wave which extends through the second dielectric layer 108 and into the semiconductor layer 110 decay exponentially as indicated by 124 and 126, respectively, with the component 120 extending through the second dielectric layer 108 and into the semiconductor layer 110 decaying more slowly than the component 118 extending into the metal layer 106.

There is a certain probability that the component 120 of the evanescent wave extending through the second dielectric layer 108 and into the semiconductor layer 110 will create an electron-hole pair in the semiconductor layer 110 consisting of a hole 128 and an electron 130. If this occurs, the surface plasmon 116 is absorbed. The probability that an electron-hole pair will be created depends on the path length of the surface plasmon 116—the longer the path length, the greater the probability that an electron-hole pair will be created. The electron 130 created when the surface plasmon 116 is absorbed contributes to a light detection current $I_L$ generated in the semiconductor layer 110. The electrons constituting the light detection current $I_L$ are collected by a charge collecting structure which is not shown in FIG. 4 for the sake of simplicity. Charge collecting structures are known in the art.

The monochromatic sensor array 100 shown in FIG. 4 uses one grating or corrugated surface 112 tuned to the wavelength $\lambda_0$ to detect incident light having the wavelength $\lambda_0$ by converting photons having the wavelength $\lambda_0$ to surface plasmons having the wavelength $\lambda_0$. However, in order to provide a color sensor array, it is necessary to detect incident blue, green, and red light components having respective wavelengths $\lambda_B$, $\lambda_G$, and $\lambda_R$.

This can be accomplished by providing a color sensor array with three gratings or corrugated surfaces respectively tuned to the wavelengths $\lambda_B$, $\lambda_G$, and $\lambda_R$ to detect the incident blue, green, and red light components having the wavelengths $\lambda_B$, $\lambda_G$, and $\lambda_R$ by converting photons having the wavelengths $\lambda_B$, $\lambda_G$, and $\lambda_R$ to surface plasmons having the wavelengths $\lambda_B$, $\lambda_G$, and $\lambda_R$.

Figure 5:
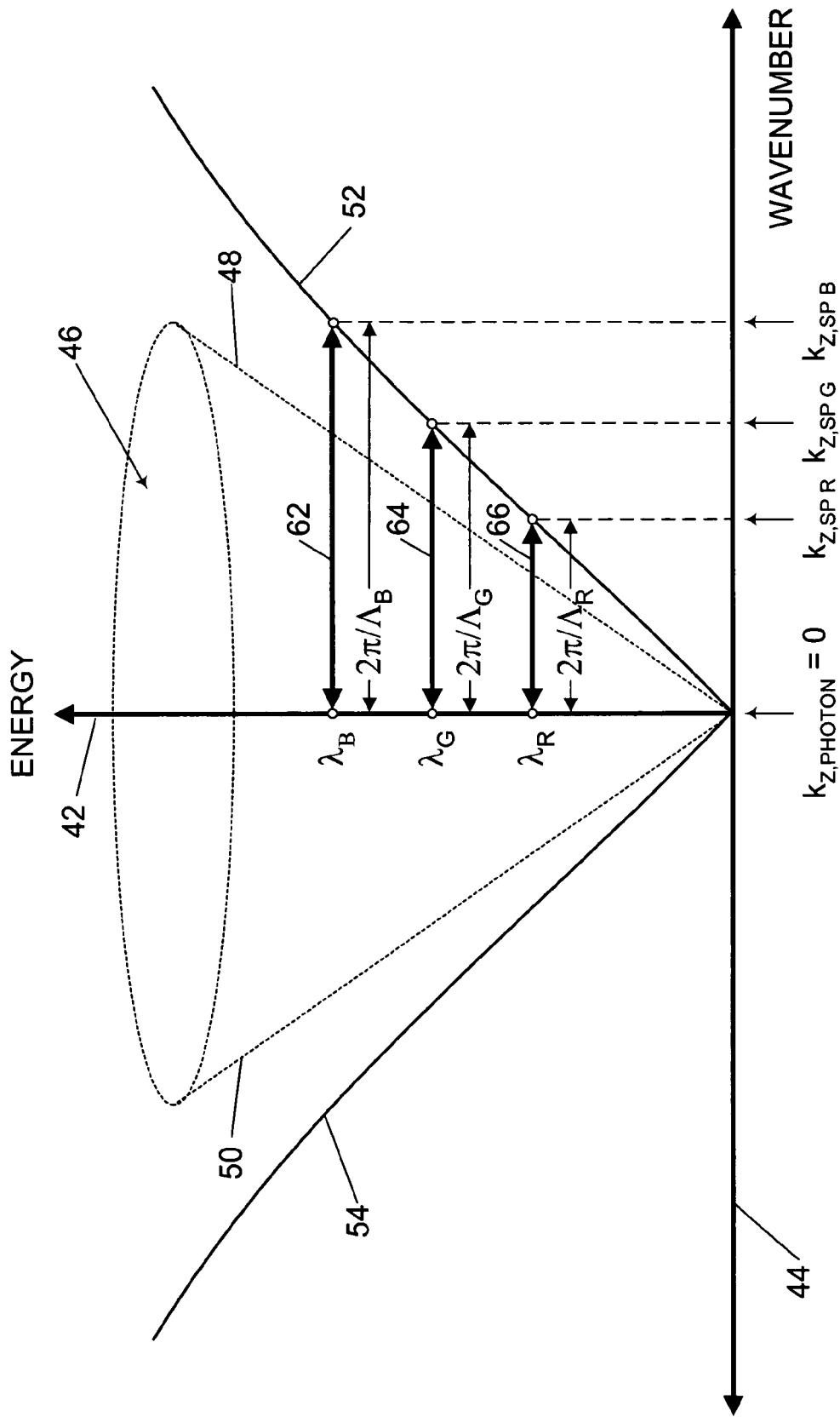
FIG. 5 is a graph of energy versus wavenumber showing a relationship between light radiative states or plane wave states lying within a light cone and surface plasmon states lying on single-interface surface plasmon dispersion curves, and showing couplings between blue, green, and red photons and surface plasmons.

FIG. 5 is a modification of FIG. 3 showing a coupling 62 of a blue photon incident normal to the metal/dielectric interface having a wavelength $\lambda_B$ and a wavenumber $k_{Z,PHOTON}=0$ with a surface plasmon having the same wavelength $\lambda_B$ and a wavenumber $k_{Z,SP\ B}=2\pi/\Lambda_B$ which is enabled by introducing a grating or corrugated surface having a periodicity $\Lambda_B$ calculated in accordance with Equation 11 (for an angle of incidence $\theta=0°$) at the metal/dielectric interface.

FIG. 5 also shows a coupling 64 of a green photon incident normal to the metal/dielectric interface having a wavelength $\lambda_G$ and a wavenumber $k_{Z,PHOTON}=0$ with a surface plasmon having the same wavelength $\lambda_G$ and a wavenumber $k_{Z,SP\ G}=2\pi/\Lambda_G$ which is enabled by introducing a grating or corrugated surface having a periodicity $\Lambda_G$ (for an angle of incidence $\theta=0°$) calculated in accordance with Equation 11 at the metal/dielectric interface.

FIG. 5 also shows a coupling 66 of a red photon incident normal to the metal/dielectric interface having a wavelength $\lambda_R$ and a wavenumber $k_{Z,PHOTON}=0$ with a surface plasmon having the same wavelength $\lambda_R$ and a wavenumber $k_{Z,SP\ R}=2\pi/\Lambda_R$ which is enabled by introducing a grating or corrugated surface having a periodicity $\Lambda_R$ calculated in accordance with Equation 11 (for an angle of incidence $\theta=0°$) at the metal/dielectric interface.

Figure 6:
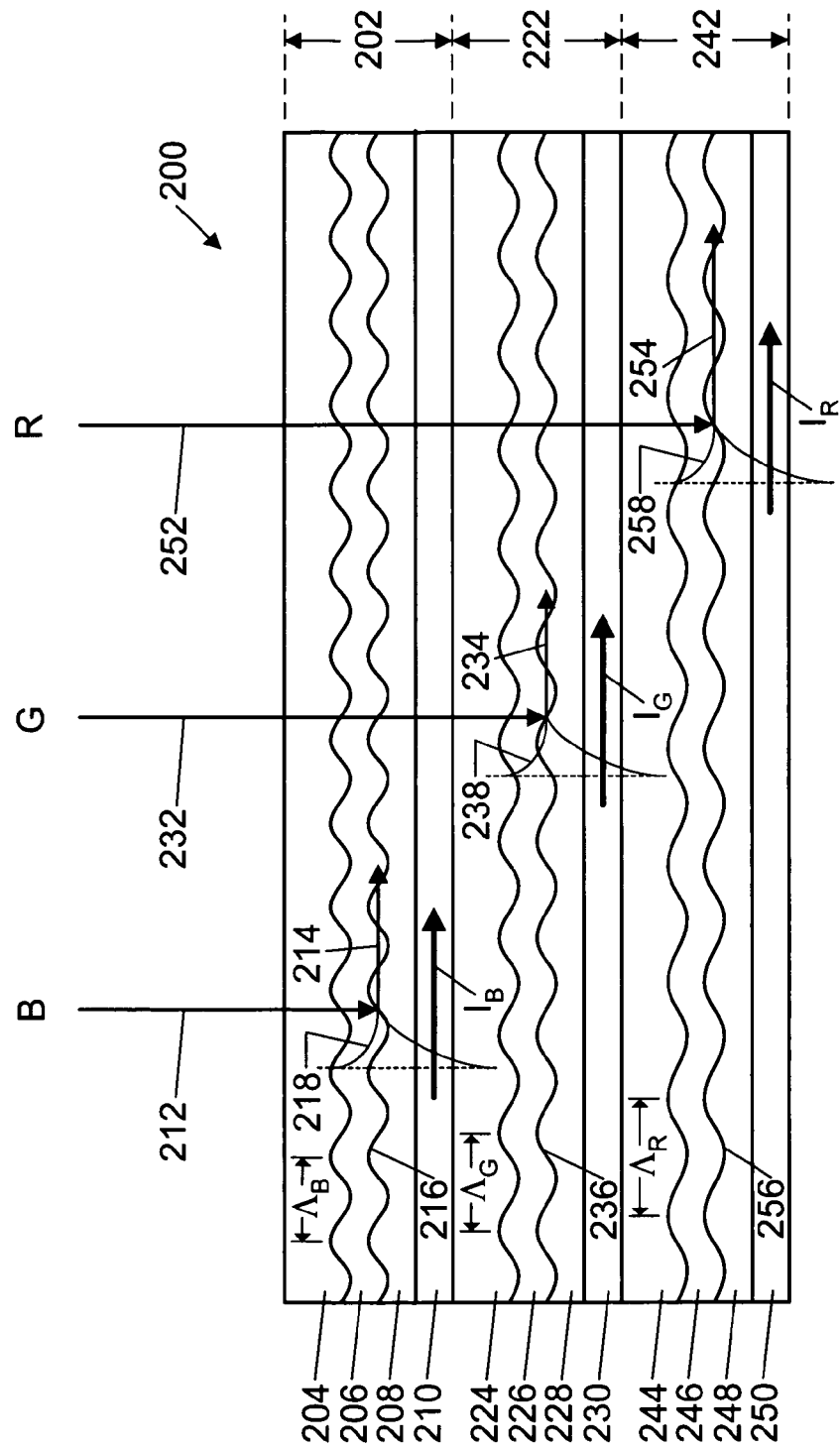
FIG. 6 shows a portion of a color sensor array in accordance with the invention.

FIG. 6 shows a portion of a color sensor array 200 in accordance with the invention which operates in accordance with the principle shown in FIG. 5 and includes a blue stack 202, a green stack 222, and a red stack 242. The other details of a color sensor array are known in the art, and are omitted in FIG. 6 for the sake of simplicity.

The blue stack 202 includes a first dielectric layer 204, a first metal layer 206, and a second dielectric layer 208 forming a first corrugated structure having a periodicity $\Lambda_B$, and a first semiconductor layer 210. A blue photon 212 incident on the color sensor array 200 is converted to a surface plasmon 214 when it reaches a first corrugated metal/dielectric interface 216 between the first metal layer 206 and the second dielectric layer 208. The surface plasmon 214 propagates along the first corrugated metal/dielectric interface 216, and as it does so, an evanescent wave of the surface plasmon 214 having an electric profile 218 generates an electron-hole pair in the first semiconductor layer 210, and the electron contributes to a blue detection current $I_B$.

The green stack 222 includes a third dielectric layer 224, a second metal layer 226, and a fourth dielectric layer 228 forming a second corrugated structure having a periodicity $\Lambda_G$, and a second semiconductor layer 230. A green photon 232 incident on the color sensor array 200 is converted to a surface plasmon 234 when it reaches a second corrugated metal/dielectric interface 236 between the second metal layer 226 and the fourth dielectric layer 228. The surface plasmon 234 propagates along the second corrugated metal/dielectric interface 236, and as it does so, an evanescent wave of the surface plasmon 234 having an electric profile 238 generates an electron-hole pair in the second semiconductor layer 230, and the electron contributes to a green detection current $I_G$.

The red stack 242 includes a fifth dielectric layer 244, a third metal layer 246, and a sixth dielectric layer 248 forming a third corrugated structure having a periodicity $\Lambda_R$, and a third semiconductor layer 250. A blue photon 252 incident on the color sensor array 200 is converted to a surface plasmon 254 when it reaches a third corrugated metal/dielectric interface 256 between the second metal layer 246 and the sixth dielectric layer 248. The surface plasmon 254 propagates along the third corrugated metal/dielectric interface 256, and as it does so, an evanescent wave of the surface plasmon 254 having an electric profile 258 generates an electron-hole pair in the third semiconductor layer 250, and the electron contributes to a red detection current $I_R$.

The metal layers in FIG. 6 may be made of Ag, Au, Al, Ni, or any other suitable metal, and preferably have a thickness on the order of 20 nm. However, any thickness may be used as long as the resultant structure is capable of generating surface plasmons and the metal layers are thin enough to transmit a substantial portion of light incident on the metal layers. The dielectric layers in FIG. 6 may be made of $SiO_2$ or any other suitable dielectric. The semiconductor layers in FIG. 6 may be pn junction layers, or pin junction layers, or any other suitable semiconductor layers in which electron-hole pairs can be created. The electrons constituting the blue detection current $I_B$, the green detection current $I_G$, and the red detection current $I_R$ are detected by respective charge collecting structures which are not shown in FIG. 6 for the sake of simplicity. Charge collecting structures are known in the art.

The blue detection current $I_B$ is susceptible to green and red crosstalk because the green and red light pass through the first semiconductor layer 210 in which the blue detection current $I_B$ is generated, and thus there is a possibility that a portion of the blue detection current $I_B$ will actually have been generated by the green and red light as a result of the plane waves of the green and red light generating electron-hole pairs in the first semiconductor layer 210. However, the electric field of the evanescent wave of the surface plasmons 214 generated by the blue light is much stronger than the electric field of the plane waves of the green and red light passing through the first semiconductor layer 210, so the green and red crosstalk in the blue detection current $I_B$ in the color sensor array 200 in accordance with the invention shown in FIG. 6 is much less than in the color sensor array 20 of the relevant art shown in FIG. 2.

Likewise, the green detection current $I_G$ is susceptible to red crosstalk because the red light passes through the second semiconductor layer 230 in which the green detection current $I_G$ is generated, and thus there is a possibility that a portion of the green detection current $I_G$ will actually have been generated by the red light as a result of the plane wave of the red light generating electron-hole pairs in the second semiconductor layer 230. However, the electric field of the evanescent wave of the surface plasmons 234 generated by the green light is much stronger than the electric field of the plane wave of the red light passing through the second semiconductor layer 230, so the red crosstalk in the green detection current $I_G$ in the color sensor array 200 in accordance with the invention shown in FIG. 6 is much less than in the color sensor array 20 of the relevant art shown in FIG. 2.

In order to fabricate the color sensor array 200 shown in FIG. 6, it will typically be necessary to separately fabricate the blue stack 202, the green stack 222, and the red stack 242, and them laminate these three units together, which may present some difficulties in fabrication. Thus, it would be desirable to reduce the number of units which must be laminated together.

Figure 7:
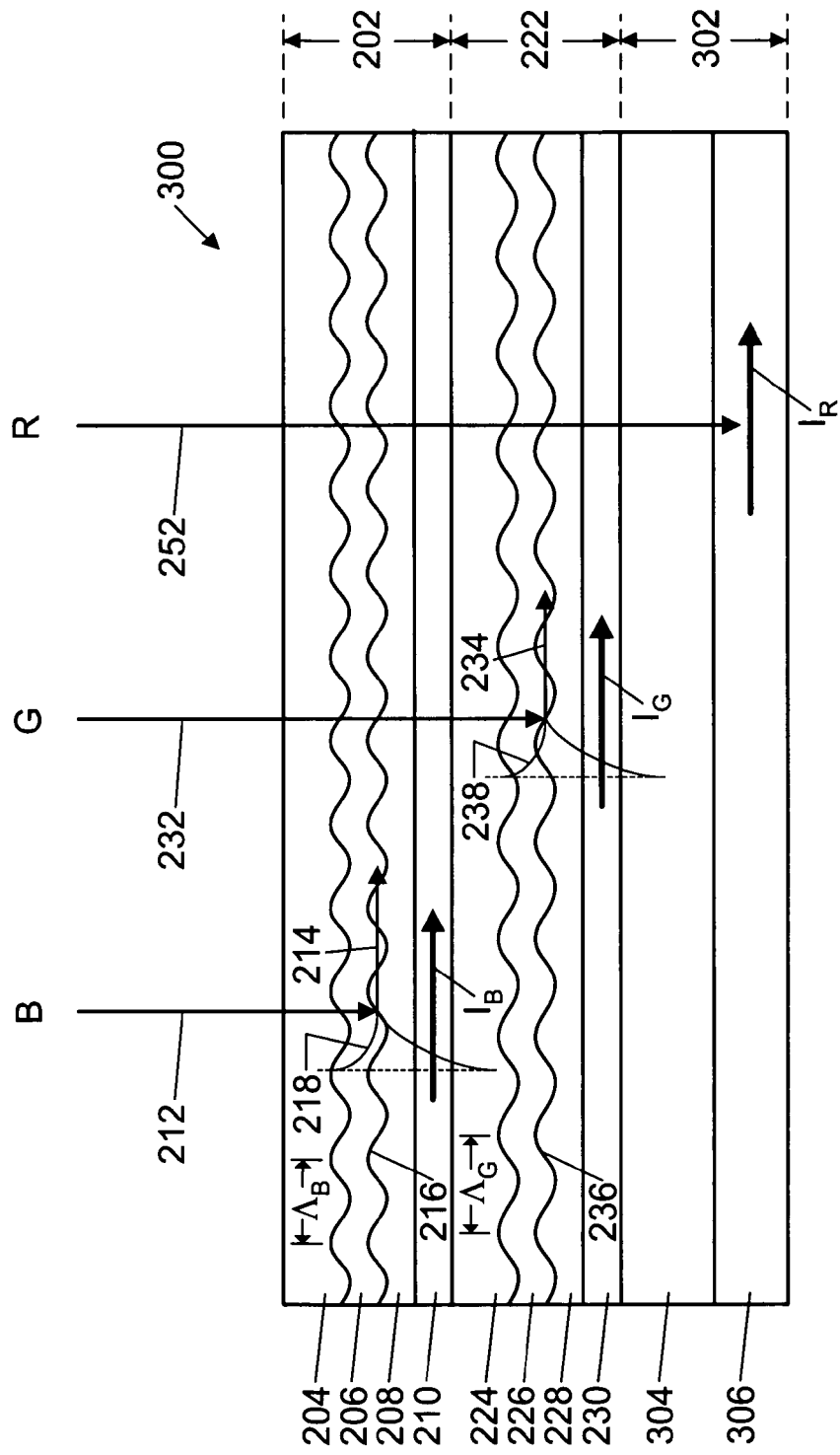
FIG. 7 shows a portion of another color sensor array in accordance with the invention.

FIG. 7 shows a color sensor array 300 in accordance with the invention which is a modification of the color sensor array 200 shown in FIG. 6 and includes a blue stack 202, a green stack 222, and a red stack 302. The other details of a color sensor array are known in the art, and are omitted in FIG. 7 for the sake of simplicity.

The blue stack 202 and the green stack 222 in FIG. 7 are the same as those in FIG. 6.

The red stack 302 in FIG. 7 replaces the red stack 242 in FIG. 6, and includes a fifth dielectric layer 304 which may be made of $SiO_2$ or any other suitable dielectric, and a third semiconductor layer 306 which may be a pn junction layer, or a pin junction layer, or any other suitable semiconductor layer in which electron-hole pairs can be created. The red stack 302 does not have a corrugated structure that generates surface plasmons as does the red stack 242 in FIG. 6. Rather, an electric field of a plane wave of the red photon 252 generates an electron-hole pair in the semiconductor layer 306 in the normal manner, and the electron contributes to the red detection current $I_R$. The electrons constituting the red detection current $I_R$ are collected by a charge collecting structure which is not shown in FIG. 7 for the sake of simplicity. Charge collecting structures are known in the art.

The green stack 222 and the red stack 302 in FIG. 7 can be fabricated as one unit, which can then be laminated together with the blue stack 202 to form the color sensor array 300. Thus, the color sensor array 300 in FIG. 7 is easier to fabricate than the color sensor array 200 in FIG. 6 because it requires laminating only two units together. However, the fabrication still requires laminating two units together, which may present some difficulties in fabrication. Thus, it would be desirable to eliminate the necessity to laminate units together entirely.

Another potential drawback to the color sensor array 200 in FIG. 6 and the color sensor array 300 in FIG. 7 is that the green light must pass through the first metal layer 206, and the red light must pass through the first metal layer 206 and the second metal layer 226. Although the first metal layer 206 and the second metal layer 226 are made thin enough to transmit light, some loss of green and red light will unavoidably occur, thereby decreasing the sensitivity of the color sensor arrays 200 and 300 to green and red light. Accordingly, it would be desirable to minimize the number of metal layers that the green and red light must pass through.

It is possible to avoid the need to laminate two or three units together and to eliminate all but one of the metal layers by detecting blue and green light using long-range coupled surface plasmons and short-range coupled surface plasmons generated by a single metal layer.

Figure 8:
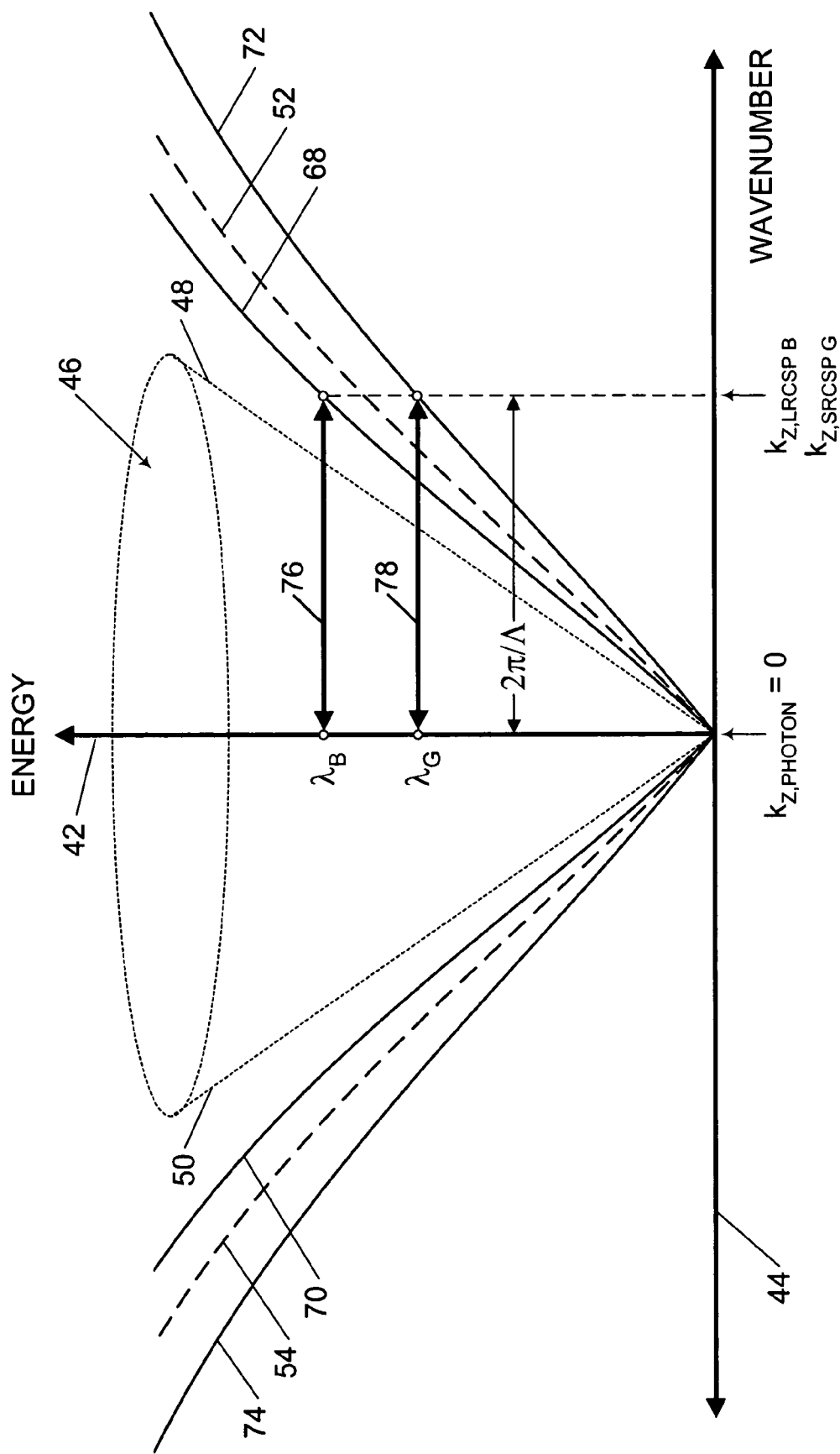
FIG. 8 is a graph of energy versus wavenumber showing a relationship between light radiative states or plane wave states lying within a light cone and surface plasmon states lying on long-range coupled surface plasmon (LRCSP) dispersion curves and short-range coupled surface plasmon (SRCSP) dispersion curves, and showing a coupling between a blue photon and a long-range coupled surface plasmon, and a coupling between a green photon and a short-range coupled surface plasmon.

As the thickness of a metal layer sandwiched between two dielectric layers having identical or nearly identical indices of refraction decreases below a certain thickness (about 100 nm for Ag), the single-interface surface plasmon dispersion curves 52 and 54 in FIG. 3 split into long-range coupled surface plasmon (LRCSP) dispersion curves 68 and 70 and short-range coupled surface plasmon (SRCSP) dispersion curves 72 and 74 as shown in FIG. 8. As the thickness of the metal layer continues to decrease, the LRCSP dispersion curves 68 and 70 continue to rotate toward the light cone 46, and the SRCSP dispersion curves 72 and 74 continue to rotate away from the light cone 46 at a faster rate than the LRCSP dispersion curves 68 and 70 rotate toward the light cone 46. Thus, the separation between the LRCSP dispersion curves 68 and 70 and the SRCSP dispersion curves 72 and 74 increases as the thickness of the metal layer decreases.

The LRCSP dispersion curves 68 and 70 and the SRCSP dispersion curves 72 and 74, like the single-interface surface plasmon dispersion curves 52 and 54, are outside the light cone 46. Accordingly, under normal circumstances, light radiative states inside the light cone 46 cannot couple with LRCSP states on the LRCSP dispersion curves 68 and 70 or with SRCSP states on the SRCSP dispersion curves 72 and 74. However, this inability of the light radiative states to couple with the LRCSP and SRCSP states can be overcome by introducing a grating or corrugated surface at a metal/dielectric interface as discussed above in connection with FIG. 3.

FIG. 8 is a modification of FIG. 3 showing a coupling 76 of a blue photon incident normal to the metal/dielectric interface having a wavelength $\lambda_B$ and a wavenumber $k_{Z,PHOTON}=0$ with an LRCSP having the same wavelength $\lambda_B$ and a wavenumber $k_{Z,LRCSP\ B}=2\pi/\Lambda$ which is enabled by introducing a grating or corrugated surface having a periodicity $\Lambda$ at the metal/dielectric interface.

FIG. 8 also shows a coupling 78 of a green photon incident normal to the metal/dielectric interface having a wavelength $\lambda_G$ and a wavenumber $k_{Z,PHOTON}=0$ propagating normal to a corrugated metal/dielectric interface with an SRCSP having the same wavelength $\lambda_G$ and a wavenumber $k_{Z,SRCSP\ G}=2\pi/\Lambda$ which is enabled by introducing the grating or corrugated surface having the periodicity $\Lambda$ at the metal/dielectric interface.

Figure 9:
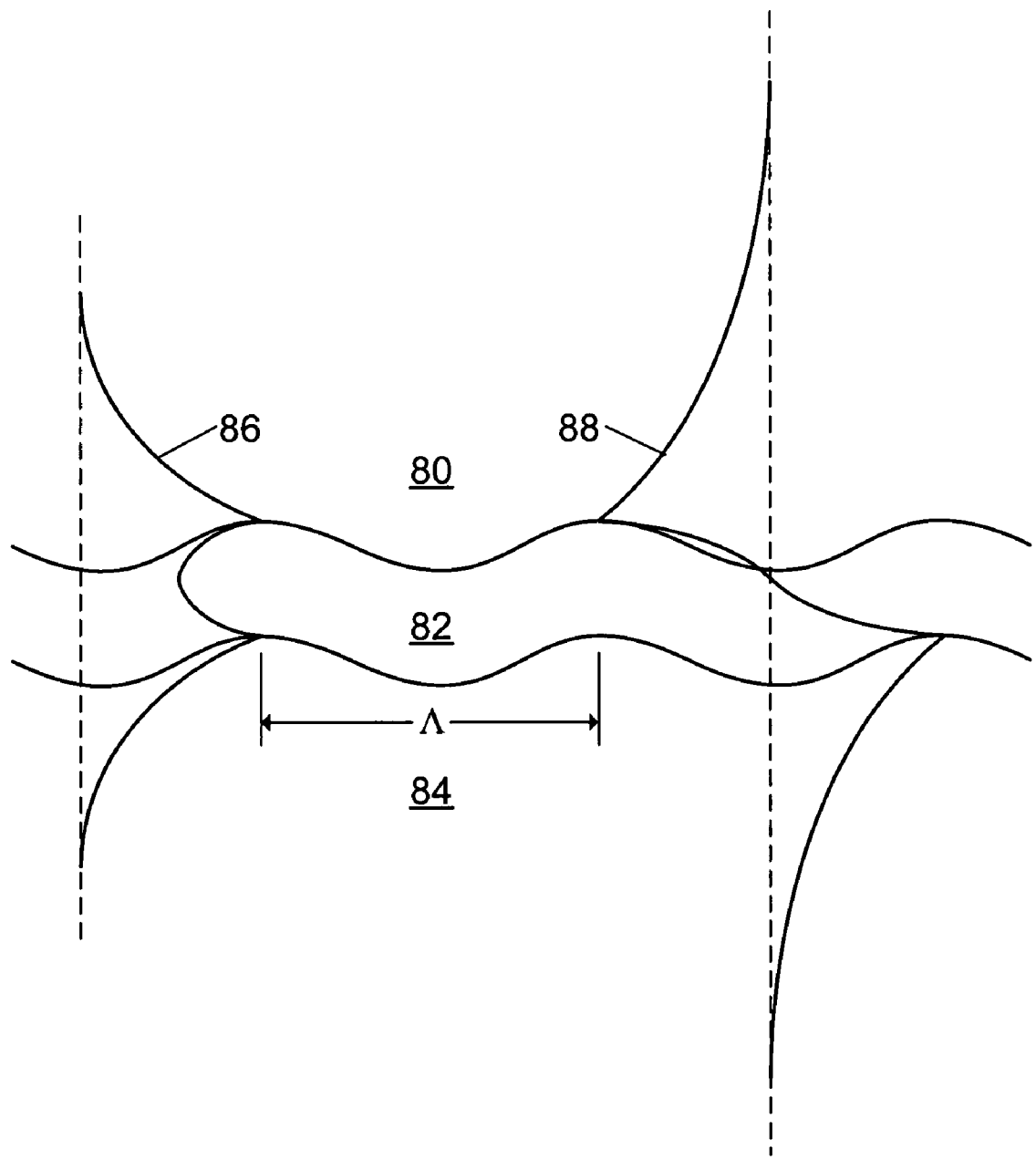
FIG. 9 shows a symmetric electric field profile of a short-range coupled surface plasmon and an anti-symmetric electric field profile of a long-range coupled surface plasmon.

FIG. 9 shows a first dielectric layer 80, a metal layer 82, and a second dielectric layer 84 forming a corrugated structure having a periodicity $\Lambda$. The metal layer 82 is thin enough so that the electric field of a surface plasmon formed at the interface between the metal layer 82 and the first dielectric layer 80 will overlap and couple with the electric field of a surface plasmon formed at the interface between the metal layer 82 and the second dielectric layer 84 to form a coupled surface plasmon which can have either a symmetric field profile 86 or an anti-symmetric field profile 88. The first dielectric layer 80 and the second dielectric layer 84 must have identical or nearly identical indices of refraction to enable the generation of coupled surface plasmons.

In the symmetric electric field profile 86, the electric fields of the two surface plasmons have the same polarity in the metal layer 82, and thus add together in the metal layer 82 so that the electric field in the metal layer 82 never goes to zero. This effectively pulls the electric field of the coupled surface plasmon into the metal layer 82, which increases the overall absorption losses of this coupled surface plasmon as compared to the single-interface surface plasmon 116 in FIG. 4 because the absorption losses are substantially higher in the metal layer 82 than they are in the first dielectric layer 80 and the second dielectric layer 84. The increase in absorption losses decreases the lifetime of the coupled surface plasmon, which reduces the distance the coupled surface plasmon can propagate before being absorbed. For this reason, a coupled surface plasmon with the symmetric electric field profile 86 is called a short-range coupled surface plasmon or SRCSP. SRCSP states lie on the SRCSP dispersion curves 72 and 74 in FIG. 8.

In the anti-symmetric electric field profile 88, the electric fields of the two surface plasmons have opposite polarities in the metal layer 82, and thus subtract from one another in the metal layer 82 so that the electric field in the metal layer 82 goes to zero. This effectively pushes the electric field of the coupled surface plasmon out of the metal layer 82 into the first dielectric layer 80 and the second dielectric layer 84, which decreases the overall absorption losses of this coupled surface plasmon as compared to the single-interface surface plasmon 116 in FIG. 4 because the absorption losses are substantially lower in the first dielectric layer 80 and the second dielectric layer 84 than they are in the metal layer 82. The decrease in absorption losses increases the lifetime of the coupled surface plasmon, which increases the distance the coupled surface plasmon can propagate before being absorbed. For this reason, a coupled surface plasmon with the anti-symmetric electric field profile 80 is called a long-range coupled surface plasmon or LRCSP. LRCSP states lie on the LRCSP dispersion curves 68 and 70 in FIG. 8.

The metal layer 82 must be thin enough to enable the electric fields of the two surface plasmons to overlap and couple with each other to form coupled surface plasmons, and to obtain a sufficient separation between the LRCSP dispersion curves 68 and 70 and the SRCSP dispersion curves 72 and 74 in FIG. 8 to enable coupling between blue photons and LRCSPs and between green photons and SRCSPs. If the metal layer 82 is made of Ag, a suitable thickness is on the order of about 20 nm. In that case, the symmetric electric field profile 86 of the SRCSP extends about 100 nm into the first dielectric layer 80 and the second dielectric layer 84, and the anti-symmetric electric field profile 88 of the LRCSP extends about 150 nm into the first dielectric layer 80 and the second dielectric layer 84. If the metal layer 82 is made of some other metal such as Au, Al, Ni, or any other suitable metal, a suitable thickness may be determined by experimentation. The first dielectric layer 80 and the second dielectric layer 84 may be made of $SiO_2$ or any other suitable dielectric material.

Figure 10:
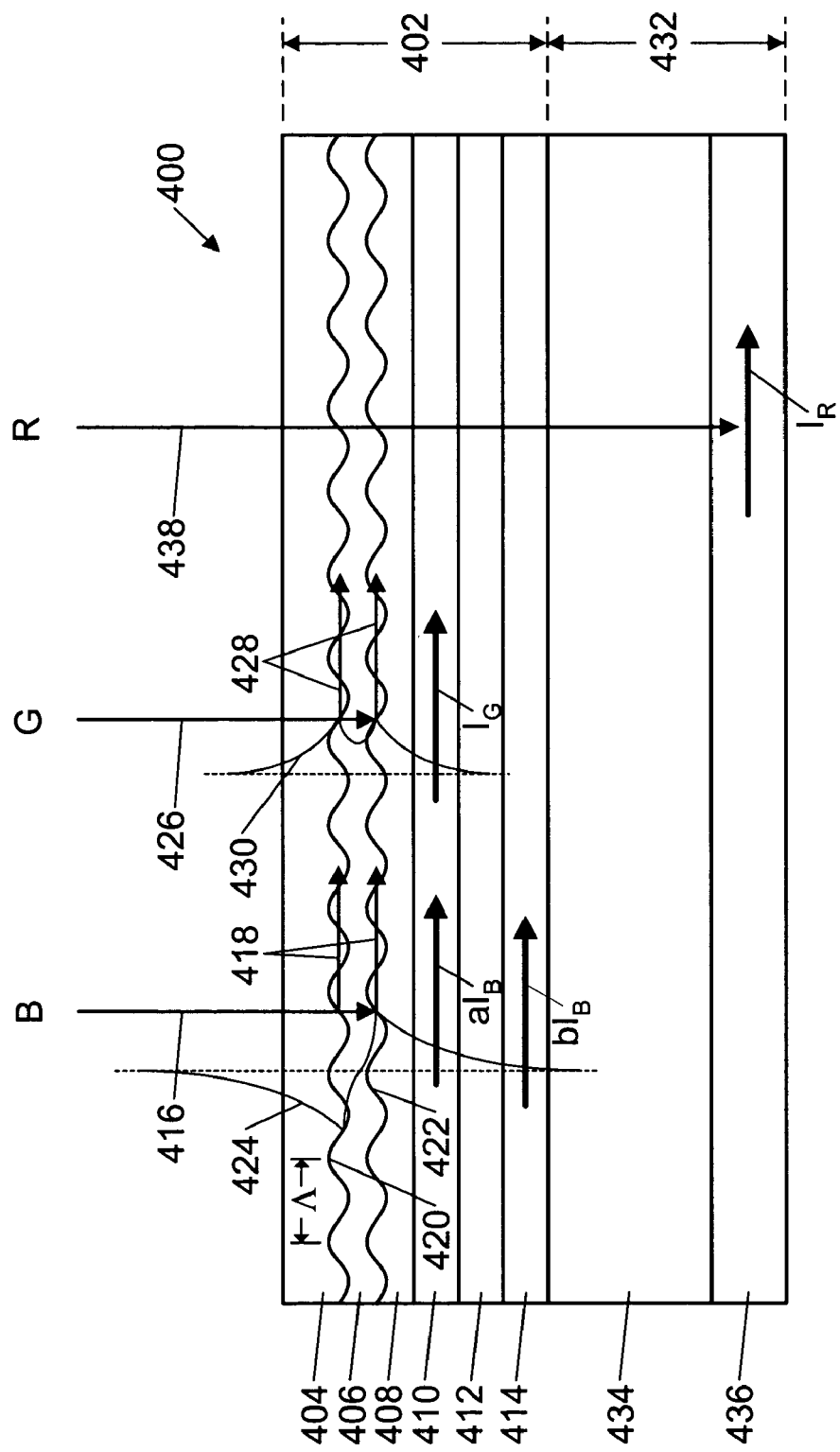
FIG. 10 shows a portion of another color sensor array in accordance with the invention.

FIG. 10 shows a portion of a color sensor array 400 in accordance with the invention which operates in accordance with the principle shown in FIGS. 8 and 9, and includes a blue/green stack 402 and a red stack 432. The other details of a color sensor array are known in the art, and are omitted in FIG. 10 for the sake of simplicity.

The blue/green stack 402 includes a first dielectric layer 404, a metal layer 406, and a second dielectric layer 408 forming a corrugated structure having a periodicity Λ, a first semiconductor layer 410, a third dielectric layer 412, and a second semiconductor layer 414.

A blue photon 416 incident on the color sensor array 400 is converted to a long-range coupled surface plasmon (LRCSP) 418 when it reaches a first corrugated metal/dielectric interface 420 between the metal layer 406 and the first dielectric layer 404, and a second corrugated metal/dielectric interface 422 between the metal layer 406 and the second dielectric layer 408. The LRCSP 418 propagates along the first corrugated metal/dielectric interface 420 and the second corrugated metal/dielectric interface 422, and as it does so, an evanescent wave of the LRCSP 418 having an anti-symmetric electric profile 424 either generates an electron-hole pair in the first semiconductor layer 410, and the electron contributes to a first partial blue detection current $aI_B$, or generates an electron-hole pair in the second semiconductor layer 414, and the electron contributes to a second partial blue detection current $bI_B$, where a<1, b<1, and a+b=1. The generation of electron-hole pairs is a quantum interaction, and there is a probability that an electron-hole pair will be generated in either the first semiconductor layer 410 or the second semiconductor layer 414.

A green photon 426 incident on the color sensor array 400 is converted to a short-range coupled surface plasmon (SRCSP) 428 when it reaches the first corrugated metal/dielectric interface 420 between the metal layer 406 and the first dielectric layer 404, and the second corrugated metal/dielectric interface 422 between the metal layer 406 and the second dielectric layer 408. The SRCSP 428 propagates along the first corrugated metal/dielectric interface 420 and the second corrugated metal/dielectric interface 422, and as it does so, an evanescent wave of the SRCSP 428 having a symmetric electric profile 430 generates an electron-hole pair in the second semiconductor layer 414, and the electron contributes to a green detection current $I_G$.

The red stack 432 includes a fourth dielectric layer 434 and a third semiconductor layer 436. The red stack 432 does not have a corrugated structure which generates surface plasmons as does the red stack 242 in FIG. 6. Rather, an electric field of a plane wave of a red photon 438 generates an electron-hole pair in the semiconductor layer 436 in the normal manner, and the electron contributes to the red detection current $I_R$.

A total detection current $I_T$ generated in the first semiconductor layer 410 is $I_T=I_G+aI_B$. Thus, $I_G=I_T-aI_B$. A total blue detection current $I_B$ is $I_B=aI_B+bI_B$. The second partial blue detection current $bI_B$ can be measured directly since it is the only detection current generated in the second semiconductor layer 412. If the value of a/b is known, it is possible to calculate $I_G$ from $I_G=I_T-(a/b)(bI_B)$, and to calculate $I_B$ from $I_B=(a/b)(bI_B)+bI_B$.

The value of a/b may be determined in various ways. For example, the value a/b may be estimated by calculating the ratio of the strength of the electric field profile 424 of the LRCSP 418 in the first semiconductor layer 410 to the strength of the electric field profile 424 of the LRCSP 418 in the second semiconductor layer 414 based on the geometry of the structure shown in FIG. 10.

Alternatively, the color sensor array 400 may be illuminated with only blue light and the first partial blue detection current $aI_B$ and the second partial blue detection current $bI_B$ may be measured, and a/b may be calculated from $a/b=(aI_B)/(bI_B)$.

The metal layer 406 in FIG. 10 may be made of Ag, Au, Al, Ni, or any other suitable metal. If the metal layer 406 is made of Ag, a suitable thickness is on the order of about 20 nm. However, any thickness may be used as long as the resulting structure is capable of generating coupled surface plasmons and the metal layer 406 is thin enough to transmit a substantial portion of light incident on the metal layer 406. The dielectric layers in FIG. 10 may be made of SiO$_2$ or any other suitable dielectric. However, the first dielectric layer 404 and the second dielectric layer 408 sandwiching the metal layer 406 must have identical or nearly identical indices of refraction to enable the generation of coupled surface plasmons. The semiconductor layers in FIG. 10 may be pn junction layers, or pin junction layers, or any other suitable semiconductor layers in which electron-hole pairs can be created. The electrons constituting the total detection current $I_T$, the second partial blue detection current $bI_B$, and the red detection current $I_R$ are collected by respective charge collecting structures which are not shown in FIG. 10 for the sake of simplicity. Charge collecting structures are known in the art.

The blue/green stack 402 and the red stack 432 in FIG. 10 can be fabricated as one unit, thus eliminating the necessity of laminating two or more units together as may be required to fabricate the color sensor arrays 200 and 300 in FIGS. 6 and 7.

Also, the color sensor array 400 in FIG. 10 has only one metal layer, thereby reducing the loss of green and red light and thus improving the sensitivity of the color sensor array 400 to green and red light as compared to the color sensor arrays 200 and 300 in FIGS. 6 and 7.

The corrugated metal/dielectric interfaces in FIGS. 4, 6, 7, 9, and 10 may have a sinusoidal profile, which may be formed using standard holographic and etching techniques. Alternatively, the corrugated metal/dielectric interfaces may have a nonsinusoidal profile such as a rectangular profile, which may be formed using standard photolithography techniques. A nonsinusoidal profile will enable generation of surface plasmons for a wider range of wavelengths and/or a wider range of angles of incidence than a sinusoidal profile. For higher efficiency, the corrugated metal/dielectric interfaces may be bi-gratings, i.e., the corrugations may extend in two orthogonal directions.

Although a few embodiments in accordance with the invention have been shown and described, it would be appreciated by those skilled in the art that changes may be made in these embodiments without departing from the principles and spirit of the invention, the scope of which is defined in the claims and their equivalents.

What is claimed is:

1. A color sensor array comprising:
   a first corrugated metal/dielectric interface that converts a first color component of incident light to first surface plasmons;
   a second corrugated metal/dielectric interface that converts a second color component of the incident light to second surface plasmons; and
   a third corrugated metal/dielectric interface that converts a third color component of the incident light to third surface plasmons,
   wherein the first corrugated metal/dielectric interface is stacked above and covers the second corrugated metal/dielectric interface and the second corrugated metal/dielectric interface is stacked above and covers the third corrugated metal/dielectric interface.

2. The color sensor array of claim 1, further comprising:
   a first metal layer having a first corrugated surface and a second corrugated surface each having a first periodicity determined in accordance with a wavelength of the first color component;
   a first dielectric layer having a corrugated surface having the first periodicity and contacting the first corrugated surface of the first metal layer;
   a second dielectric layer having a corrugated surface having the first periodicity and contacting the second corrugated surface of the first metal layer to form the first corrugated metal/dielectric interface;
   a second metal layer having a first corrugated surface and a second corrugated surface each having a second periodicity determined in accordance with a wavelength of the second color component;
   a third dielectric layer having a corrugated surface having the second periodicity and contacting the first corrugated surface of the second metal layer;
   a fourth dielectric layer having a corrugated surface having the second periodicity and contacting the second corrugated surface of the second metal layer to form the second corrugated metal/dielectric interface; a third metal layer having a first corrugated surface and a second corrugated surface each having a third periodicity determined in accordance with a wavelength of the third color component;
   a fifth dielectric layer having a corrugated surface having the third periodicity and contacting the first corrugated surface of the third metal layer; and
   a sixth dielectric layer having a corrugated surface having the third periodicity and contacting the second corrugated surface of the third metal layer to form the third corrugated metal/dielectric interface.

3. The color sensor array of claim 2, further comprising:
   a first semiconductor layer disposed between the second dielectric layer and the third dielectric layer;
   a second semiconductor layer disposed between the fourth dielectric layer and the fifth dielectric layer; and
   a third semiconductor layer disposed on an opposite side of the sixth dielectric layer from the third metal layer.

4. The color sensor array of claim 3,
   wherein an electric field of the first surface plasmons extends into the first semiconductor layer and generates a first color component detection current in the first semiconductor layer;
   wherein an electric field of the second surface plasmons extends into the second semiconductor layer and generates a second color component detection current in the second semiconductor layer; and
   wherein an electric field of the third surface plasmons extends into the third semiconductor layer and generates a third color component detection current in the third semiconductor layer.

5. The color sensor array of claim 2, wherein the first metal layer, the second metal layer, and the third metal layer are made of Ag and have a thickness of about 20 nm.

6. The color sensor array of claim 1, wherein the first color component is a blue color component, the second color component is a green color component, and the third color component is a red color component.

7. The color sensor array of claim 1, wherein a first portion of the incident light penetrates through the first corrugated metal/dielectric interface to reach the second corrugated metal/dielectric interface, and a second portion, smaller than the first portion, of the incident light penetrates through the second corrugated metal/dielectric interface to reach the third corrugated metal/dielectric interface.

8. A color sensor array comprising:
   a first corrugated metal/dielectric interface that converts a first color component of incident light to first surface plasmons;
   a second corrugated metal/dielectric interface that converts a second color component of the incident light to second surface plasmons; and a detection structure that converts a third color component of the incident light to a third color component detection current, wherein the first corrugated metal/dielectric interface is stacked above and covers the second corrugated metal/dielectric interface and the second corrugated metal/dielectric interface is stacked above and covers the detection structure.

9. The color sensor array of claim 8, further comprising;

a first metal layer having a first corrugated surface and a second corrugated surface each having a first periodicity determined in accordance with a wavelength of the first color component;

a first dielectric layer having a corrugated surface having the first periodicity and contacting the first corrugated surface of the first metal layer;

a second dielectric layer having a corrugated surface having the first periodicity and contacting the second corrugated surface of the first metal layer to form the first corrugated metal/dielectric interface;

a second metal layer having a first corrugated surface and a second corrugated surface each having a second periodicity determined in accordance with a wavelength of the second color component;

a third dielectric layer having a corrugated surface having the second periodicity and contacting the first corrugated surface of the second metal layer; and a fourth dielectric layer having a corrugated surface having the second periodicity and contacting the second corrugated surface of the second metal layer to form the second corrugated metal/dielectric interface.

10. The color sensor array of claim 9, further comprising:

a first semiconductor layer disposed between the second dielectric layer and the third dielectric layer; and a second semiconductor layer disposed on an opposite side of the fourth dielectric layer from the second metal layer;

wherein the detection structure comprises:

a fifth dielectric layer disposed on an opposite side of the second semiconductor layer from the fourth dielectric layer, and a third semiconductor layer disposed on an opposite side of the fifth dielectric layer from the second semiconductor layer.

11. The color sensor array of claim 10, wherein an electric field of the first surface plasmons extends into the first semiconductor layer and generates a first color component detection current in the first semiconductor layer;

wherein an electric field of the second surface plasmons extends into the second semiconductor layer and generates a second color component detection current in the second semiconductor layer; and wherein an electric field of the third color component generates the third color component detection current in the third semiconductor layer.

12. The color sensor array of claim 9, wherein the first metal layer and the second metal layer are made of Ag and have a thickness of about 20 nm.

13. The color sensor array of claim 8, wherein the first color component is a blue color component, the second color component is a green color component, and the third color component is a red color component.

14. The color sensor array of claim 8, wherein a first portion of the incident light penetrates through the first corrugated metal/dielectric interface to reach the second corrugated metal/dielectric interface, and a second portion, smaller than the first portion, of the incident light penetrates through the second corrugated metal/dielectric interface to reach the detection structure.

* * * * *